(12) United States Patent
Kim et al.

(10) Patent No.: US 9,105,581 B2
(45) Date of Patent: Aug. 11, 2015

(54) METHOD OF PROCESSING A SUBSTRATE AND APPARATUS FOR PERFORMING THE SAME

(71) Applicant: Samsung Electronics Co., Ltd., Suwon-Si, Gyeonggi-Do (KR)

(72) Inventors: Sam Hyung-sam Kim, Suwon-si (KR); Gon-Jun Kim, Suwon-si (KR); Volynets Vladmir, Suwon-si (KR); Yong-Kyun Park, Suwon-si (KR); In-Cheol Song, Hwaseong-si (KR); Sang-Heon Lee, Seongnam-si (KR); Sang-Jean Jeon, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/297,024

(22) Filed: Jun. 5, 2014

(65) Prior Publication Data
US 2015/0155178 A1    Jun. 4, 2015

(30) Foreign Application Priority Data
Dec. 4, 2013   (KR) .................. 10-2013-0150053

(51) Int. Cl.
*H01L 21/3065*  (2006.01)
*H01L 21/67*    (2006.01)
*H01L 21/3213*  (2006.01)

(52) U.S. Cl.
CPC ...... *H01L 21/3065* (2013.01); *H01L 21/32136* (2013.01); *H01L 21/6719* (2013.01); *H01L 21/67069* (2013.01)

(58) Field of Classification Search
CPC ............... H01L 37/32357; H01L 2237/334; H01L 37/32192; H01L 37/32201; H01L 21/3065; H01L 21/32136; H01L 21/6719; H05H 1/00; H05H 1/24
See application file for complete search history.

(56) References Cited

U.S. PATENT DOCUMENTS

| 4,820,377 | A | * | 4/1989 | Davis et al. ................ 134/1.1 |
| 5,242,538 | A | * | 9/1993 | Hamrah et al. ............. 216/66 |
| 6,083,344 | A | | 7/2000 | Hanawa et al. |
| 6,148,761 | A | | 11/2000 | Majewski et al. |
| 6,499,425 | B1 | * | 12/2002 | Sandhu et al. ........... 118/723 E |
| 6,755,150 | B2 | | 6/2004 | Lai et al. |
| 2007/0163440 | A1 | | 7/2007 | Kim et al. |
| 2007/0193515 | A1 | | 8/2007 | Jeon et al. |
| 2010/0012273 | A1 | | 1/2010 | Sankarakrishnan et al. |
| 2010/0170442 | A1 | | 7/2010 | Yuda et al. |
| 2010/0190098 | A1 | | 7/2010 | Walker et al. |
| 2011/0114114 | A1 | | 5/2011 | You et al. |
| 2011/0126762 | A1 | | 6/2011 | Faguet et al. |
| 2014/0227881 | A1 | * | 8/2014 | Lubomirsky et al. ......... 438/710 |

FOREIGN PATENT DOCUMENTS

| KR | 100798351 B1 | 1/2008 |
| KR | 20080013552 A | 2/2008 |
| KR | 20110008537 A | 1/2011 |

* cited by examiner

*Primary Examiner* — Duy Deo
(74) *Attorney, Agent, or Firm* — Myers Bigel Sibley & Sajovec, PA

(57) ABSTRACT

In a method of processing a substrate, a first plasma may be generated from a first reaction gas. A second plasma may be generated from a second reaction gas. The first plasma and the second plasma may be individually applied to the substrate. Thus, each of the at least two remote plasma sources may generate at least two plasmas under different process recipes, which may be optimized for processing the substrate. As a result, the substrate processed using the optimal plasmas may have a desired shape.

15 Claims, 6 Drawing Sheets

METHOD OF PROCESSING A SUBSTRATE AND APPARATUS FOR PERFORMING THE SAME

CROSS-RELATED APPLICATION

This application claims priority under 35 USC §119 to Korean Patent Application No. 2013-150053, filed on Dec. 4, 2013 in the Korean Intellectual Property Office (KIPO), the contents of which are herein incorporated by reference in their entirety.

BACKGROUND

1. Field

Example embodiments relate to methods of processing a substrate and/or apparatuses for performing the same. More particularly, example embodiments relate to methods of processing a substrate using plasma, and/or apparatuses for performing the method.

2. Description of the Related Art

Generally, an etching apparatus may include an etching chamber configured to receive a semiconductor substrate, a remote plasma source configured to generate a plasma from reaction gases, and a showerhead configured to inject the plasma to the semiconductor substrate.

According to related arts, the plasma may be generated by using a single process recipe. For example, a single pressure, a single temperature, a single power, etc., may be applied to reaction gases to generate the plasma.

However, process recipes, which may generate more than one desired plasma used for accurately etching the semiconductor substrate, may be different from each other. A pattern on the semiconductor substrate that is formed by etching a layer on the semiconductor substrate using the plasma generated by using the single recipe, may not have a desired shape.

Further, ions in the plasma generated by using the single process recipe may be provided to the semiconductor substrate and damage the layer on the semiconductor substrate.

SUMMARY

Some example embodiments provide methods of processing a substrate that may be capable of generating a plasma having a desired substrate-processing capacity.

Some example embodiments also provide apparatuses for performing the above-mentioned method.

According to an example embodiment, there may be provided a method of processing a substrate. In the method of processing the substrate, a first plasma may be generated from a first reaction gas. A second plasma may be generated from a second reaction gas. The first plasma and the second plasma may be individually applied to the substrate.

In some example embodiments, generating the first plasma may include generating the first plasma under a first process recipe. Generating the second plasma may include generating the second plasma under a second process recipe different from the first process recipe.

In some example embodiments, the method may further include extracting a first ingredient used for processing the substrate from ingredients in the first plasma, and extracting a second ingredient used for the processing the substrate from ingredients in the second plasma. The individually applying may include applying the first ingredient and the second ingredient to the substrate.

In some example embodiments, extracting the first ingredient from the first plasma may include flowing the first plasma through a first extracting hole defined in a first shower head, the first extracting hole configured to have a size through which only the first ingredient may pass. Extracting the second ingredient from the second plasma may include flowing the second plasma through a second extracting hole defined in a second shower head, the second extracting hole configured to have a size through which only the second ingredient may pass.

In some example embodiments, the first ingredient may include a first radical for etching the substrate. The second ingredient may include a second radical for etching the substrate.

In some example embodiments, the method may further include generating ions used for processing the substrate from the extracted first ingredient and the extracted second ingredient.

In some example embodiments, the generating ions may include applying bias to the extracted first ingredient and the extracted second ingredient.

In some example embodiments, the method may further include generating a third plasma from a third reaction gas, and applying the third plasma to the substrate independently from the first plasma and the second plasma.

In some example embodiments, the method may further include extracting a third ingredient used for processing the substrate from ingredients in the third plasma.

According to an example embodiment, there may be provided an apparatus for processing a substrate. The apparatus may include a processing chamber, a first remote plasma source, a second remote plasma source, a first showerhead and a second showerhead. The processing chamber may be configured to receive the substrate. The first remote plasma source may be configured to generate a first plasma from a first reaction gas. The second remote plasma source may be configured to generate a second plasma from a second reaction gas. The first showerhead may be arranged in the processing chamber. The first showerhead may be connected to the first remote plasma source to inject the first plasma to the substrate. The second showerhead may be arranged in the processing chamber. The second showerhead may be connected to the second remote plasma source to inject the second plasma to the substrate.

In some example embodiments, the first showerhead may have a first extracting hole, which has a size through which only a first ingredient among ingredients in the first plasma may pass.

In some example embodiments, the second showerhead may have a second extracting hole, which has a size through which only a second ingredient among ingredients in the second plasma may pass.

In some example embodiments, the apparatus may further include a bias-applying member configured to apply a bias to the first plasma and the second plasma injected from the first showerhead and the second showerhead, respectively, to generate ions from the injected first and second plasmas.

In some example embodiments, the apparatus may further include a third remote plasma source configured to generate a third plasma from a third reaction gas, and a third showerhead arranged in the processing chamber and connected to the third remote plasma source to inject the third plasma to the substrate.

According to example embodiments, each of the at least two remote plasma sources may generate the at least two plasmas under different process recipes that may be optimized for processing the substrate. Thus, the substrate processed using the optimal plasmas may have a desired shape. Further, ingredients in the plasma, which may damage the substrate, may be excluded. In contrast, only the ingredient used for processing the substrate may be extracted so that damage to the substrate may be minimized or suppressed.

According to an example embodiment, a method of processing a substrate may include extracting a first radical from a first plasma introduced from a first remote plasma source, extracting a second radical from a second plasma introduced from a second remote plasma source, and individually applying the first radical and the second radical to the substrate.

The extracting a first radical may include passing the first plasma through at least one extracting hole defined in a shower head.

The extracting a second radical may include passing the second plasma through at least one extracting hole defined in a shower head.

The method may further include generating ions used for processing the substrate by applying a bias to the first radical and the second radical.

The first radical and the second radical may be different from each other.

BRIEF DESCRIPTION OF THE DRAWINGS

Example embodiments will be more clearly understood from the following detailed description taken in conjunction with the accompanying drawings.

FIG. 1 is a cross-sectional view illustrating an apparatus for processing a substrate in accordance with an example embodiment;

FIG. 2 is a perspective view illustrating a first showerhead and a second showerhead of the apparatus in FIG. 1;

FIG. 3 is a flow chart illustrating a method of processing a substrate using the apparatus in FIG. 1;

FIG. 4 is a cross-sectional view illustrating an apparatus for processing a substrate in accordance with an example embodiment;

FIG. 5 is a perspective view illustrating a first showerhead and a second showerhead of the apparatus in FIG. 4; and FIG. 6 is a flow chart illustrating a method of processing a substrate using the apparatus in FIG. 4.

DETAILED DESCRIPTION OF EXAMPLE EMBODIMENTS

Figure 1:
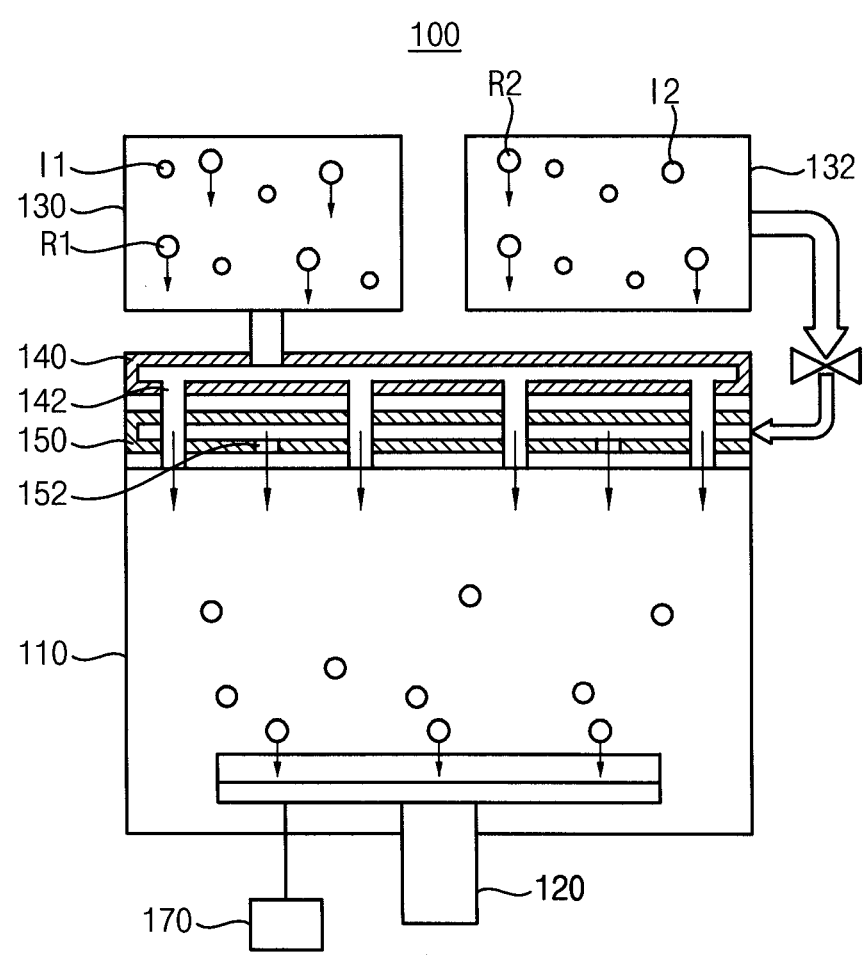
FIGS. 1 to 6 represent non-limiting, example embodiments as described herein.

Various example embodiments will be described more fully hereinafter with reference to the accompanying drawings, in which some example embodiments are shown. The present disclosure may, however, be embodied in many different forms and should not be construed as limited to the example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments. It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, example embodiments will be explained in detail with reference to the accompanying drawings.

Figure 2:
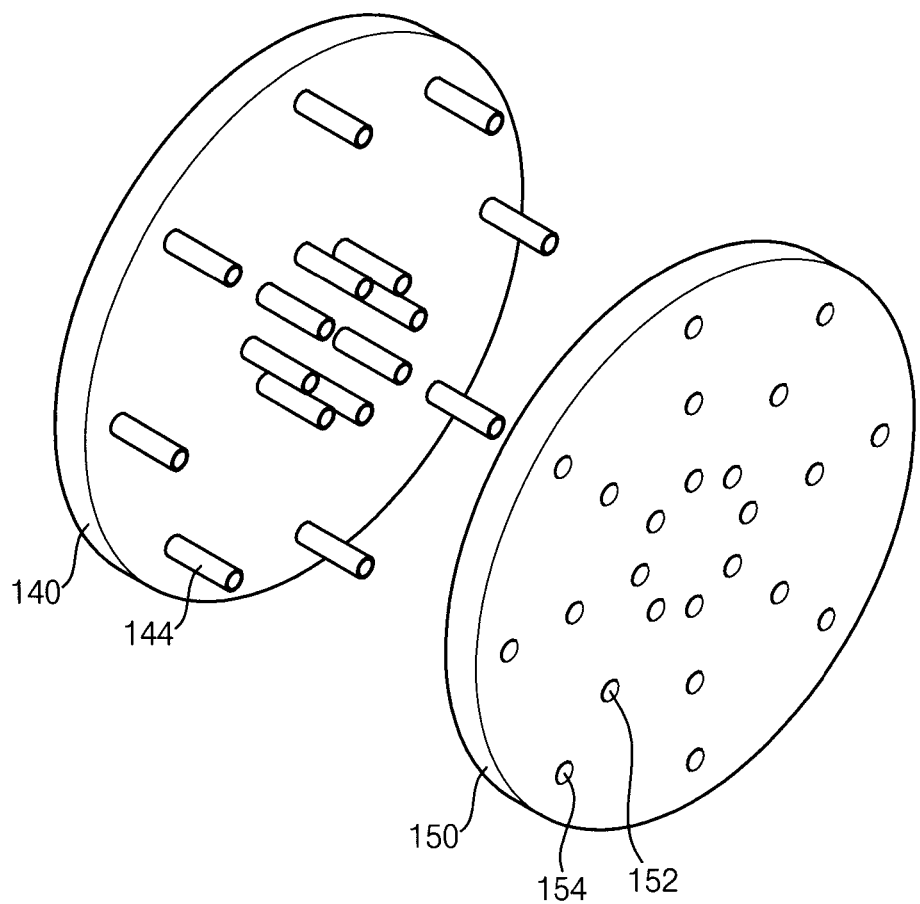

FIG. 1 is a cross-sectional view illustrating an apparatus for processing a substrate in accordance with an example embodiment, and FIG. 2 is a perspective view illustrating a first showerhead and a second showerhead of the apparatus in FIG. 1.

Referring to FIGS. 1 and 2, an apparatus 100 for processing a substrate in accordance with this example embodiment may include a processing chamber 110, a stage 120, a first remote plasma source 130, a second remote plasma source 132, a first showerhead 140, a second showerhead 150 and a bias-applying member 170.

In example embodiments, the apparatus 100 may include a plasma etching apparatus. Thus, the apparatus 100 may etch a layer on a semiconductor substrate using plasma. Alternatively, the apparatus 100 may etch a layer on a glass substrate using plasma.

The processing chamber 110 may be configured to receive the semiconductor substrate. In example embodiments, where the apparatus 100 includes an plasma etching apparatus, the processing chamber 110 may include an etching chamber.

The stage 120 may be arranged on a bottom surface of the processing chamber 110. The semiconductor substrate may be placed on an upper surface of the stage 120.

The first remote plasma source 130 may be located at an outside of the processing chamber 110. The first remote plasma source 130 may generate a first plasma from a first reaction gas. In example embodiments, where the apparatus 100 includes an plasma etching apparatus, the first reaction gas may include an etching gas.

Further, the first remote plasma source 130 may generate the first plasma from the first reaction gas under a first process recipe. The first process recipe may correspond to an optimal process recipe that may generate the first plasma used for etching a layer on the semiconductor substrate. Therefore, the first process recipe may vary in accordance with kinds of the first reaction gas. Further, the first process recipe may include, for example, a first pressure, a first temperature, and a first power.

The first plasma may include a plurality of ingredients. A first ingredient among the ingredients may be mainly used for etching the layer on the semiconductor substrate. For example, the first plasma may include, for example, a first radical R1, a first ion I1, an electron, and/or an ultraviolet light. The first radical R1 may etch the layer on the semiconductor substrate. In contrast, the first ion I1 may anisotropically etch the layer on the semiconductor substrate. The first radical R1 may be used mainly for isotropically etching the layer on the semiconductor substrate. Other ingredients, for example, the first ion I1, the electron, and/or the ultraviolet light may damage the layer on the semiconductor substrate. Thus, it may be desired to exclude, for example, the first ion I1, the electron, and/or the ultraviolet light, from the first plasma.

The second remote plasma source 132 also may be located at the outside of the processing chamber 110. The second remote plasma source 132 may generate a second plasma from a second reaction gas. In example embodiments, where the apparatus 100 may include a plasma etching apparatus, the second reaction gas may include an etching gas.

Further, the second remote plasma source 132 may generate the second plasma from the second reaction gas under a second process recipe different from the first process recipe. The second process recipe may correspond to an optimal process recipe that may generate the second plasma used for etching a layer on the semiconductor substrate. Because the second reaction gas may be different from the first reaction gas, the second process recipe may be different from the first process recipe. Therefore, the second process recipe may vary in accordance with kinds of the second reaction gas. Further, the second process recipe may include, for example, a second pressure, a second temperature, and a second power.

The second plasma may include a plurality of ingredients. A second ingredient among the ingredients may be mainly used for etching the layer on the semiconductor substrate. For example, the second plasma may include, for example, a second radical R2, a second ion I2, an electron, and an ultraviolet light. The second radical R2 may isotropically etch the layer on the semiconductor substrate. In contrast, the second ion I2 may anisotropically etch the layer on the semiconductor substrate. The second radical R2 may be mainly used for etching the layer on the semiconductor substrate. Other ingredients, for example, the second ion I2, the electron and/or the ultraviolet light, may damage the layer on the semiconductor substrate. Thus, it may be desired to exclude, for example, the second ion I2, the electron and/or the ultraviolet light, from the second plasma.

The first showerhead 140 may be positioned at an upper inner space of the processing chamber 110. The first showerhead 140 may be connected to the first remote plasma source 130. Thus, the first showerhead 140 may inject the first plasma generated from the first remote plasma source 130 to the semiconductor substrate on the stage 120.

In some example embodiments, the first showerhead 140 may have a plurality of first extracting holes 142. An injecting tube 144 connected to the first extracting holes 142 may be extended from a lower surface of the first showerhead 140. The first extracting holes 142 may have a size for allowing only the first radical R1 to pass through the first extracting holes 142. In contrast, for example, the first ion I1 and/or the electron may not pass through the first extracting holes 142. Thus, when the first plasma may flow through the first extracting holes 142, only the first radical R1 may pass through the first extracting holes 142 so that only the first radical R1 may be applied to the semiconductor substrate. In contrast, because the first ion I1 and/or the electron may not pass through the first extracting holes 142, the first ion I1 and/or the electron may not be applied to the semiconductor substrate. Therefore, damage to the layer on the semiconductor substrate caused by, for example, the first ion I1 and/or the electron may be mitigated or prevented. The size of the first extracting holes 142 may vary in accordance with kinds of the first reaction gas. Because the first radical R1 may be injected to the semiconductor substrate through the first extracting holes 142 and the injecting tube 144, the first extracting holes 142 may correspond to injecting holes of the first showerhead 140.

The second showerhead 150 may be positioned at the upper inner space of the processing chamber 110. The second showerhead 150 may be arranged under the first showerhead 140. The second showerhead 150 may be connected to the second remote plasma source 132. Thus, the second showerhead 150 may inject the second plasma generated from the second remote plasma source 132 to the semiconductor substrate on the stage 120.

In some example embodiments, the second showerhead 150 may have a plurality of second extracting holes 152. The second extracting holes 152 may have a size for allowing only the second radical R2 to pass through the second extracting holes 152. In contrast, for example, the second ion I2 and/or the electron may not pass through the second extracting holes 152. Thus, when the second plasma may flow through the second extracting holes 152, only the second radical R2 may pass through the second extracting holes 152 so that only the second radical R2 may be applied to the semiconductor substrate. In contrast, because the second ion I2 and/or the electron may not pass through the second extracting holes 152, the second ion I2 and/or the electron may not be applied to the semiconductor substrate. Therefore, damage to the layer on the semiconductor substrate caused by, for example, the second ion I2 and/or the electron, may be mitigated or prevented. The size of the second extracting holes 152 may vary in accordance with kinds of the second reaction gas. Because the second radical R2 may be injected to the semiconductor substrate through the second extracting holes 152, the second extracting holes 152 may correspond to injecting holes of the second showerhead 150.

The second showerhead 150 may have a plurality of holes 154 into which the injecting tubes 144 of the first showerhead 140 may be inserted. The first radical R1 may be injected to the semiconductor substrate through the injecting tubes 144. The second radical R2 may be injected to the semiconductor substrate through the second extracting holes 152. Therefore, the first radical R1 and the second radical R2 may be individually applied to the semiconductor substrate through the separate passageways (e.g., the injecting tubes 144 and the second extracting holes 152) so that the first radical R1 and the second radical R2 may not previously mixed with each other. As a result, the first radical R1 and the second radical R2 may be independently controlled so that an etching process for etching the layer on the semiconductor substrate may be accurately controlled.

In the event that an anisotropic etching is performed on the layer on the semiconductor substrate, the apparatus 100 may further include the bias-applying member 170. The bias-applying member 170 may be electrically connected to the stage 120. The bias-applying member 170 may apply a bias to the first radical R1 and/or the second radical R2 injected from the first showerhead 140 and the second showerhead 150, respectively, to generate ions. The ions may be applied to the layer on the semiconductor substrate to anisotropically etch the layer.

Figure 3:
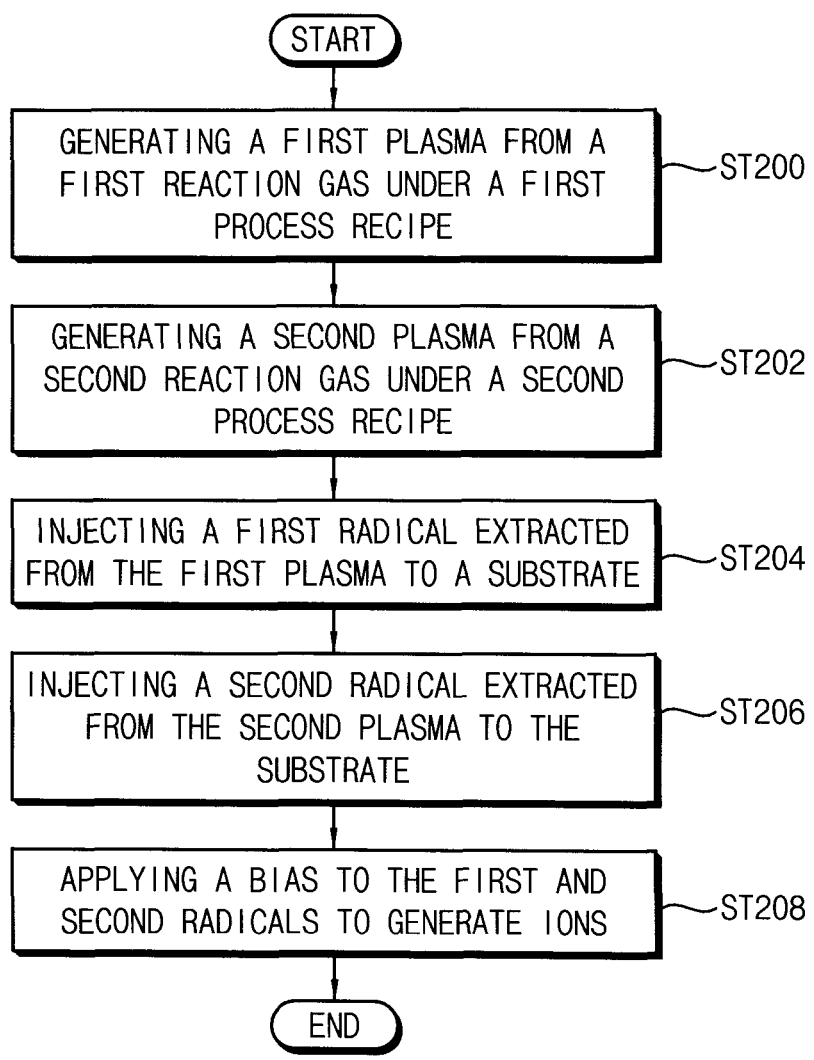

FIG. 3 is a flow chart illustrating a method of processing a substrate using the apparatus in FIG. 1.

Referring to FIGS. 1 and 3, in step ST200, the first remote plasma source 130 may generate the first plasma from the first reaction gas under the first process recipe. The first plasma may include, for example, the first radical R1 and the first ion I1. In some example embodiments, the first process recipe may correspond to an optimal process recipe for generating the first plasma from the first reaction gas.

In step ST202, the second remote plasma source 132 may generate the second plasma from the second reaction gas under the second process recipe. The second plasma may include, for example, the second radical R2 and the second ion I2. In some example embodiments, the second process recipe may correspond to an optimal process recipe for generating the second plasma from the second reaction gas.

In step ST204, the first plasma may be introduced into the first showerhead 140. When the first plasma flows through the first extracting holes 142 of the first showerhead 140, only the first radical R1 may pass through the first extracting holes 142. In contrast, for example, the first ion I1 may not pass through the first extracting holes 142. Thus, only the first radical R1 may be injected to the semiconductor substrate on the stage 120 through the injecting tubes 144 to etch the layer on the semiconductor substrate.

In step ST206, the second plasma may be introduced into the second showerhead 150. When the second plasma flows through the second extracting holes 152 of the second showerhead 150, only the second radical R2 may pass through the second extracting holes 152. In contrast, for example, the second ion I2 may not pass through the second extracting holes 152. Thus, only the second radical R2 may be injected to the semiconductor substrate on the stage 120 through the second extracting holes 152 to etch the layer on the semiconductor substrate.

In example embodiments, the first radical R1 and the second radical R2 may be individually applied to the semiconductor substrate so that the first radical R1 and the second radical R2 may be independently controlled. Thus, an etching process for etching the layer on the semiconductor substrate may be improved. Further, because the ions may not be applied to the semiconductor substrate, damage to the layer caused by the ions may be mitigated or prevented.

Additionally, in step ST208, the bias-applying member 170 may apply the bias to the first radical R1 and the second radical R2 to generate the ions from the first radical R1 and the second radical R2. The ions may be applied to the layer on the semiconductor substrate to anisotropically etch the layer.

Figure 4:
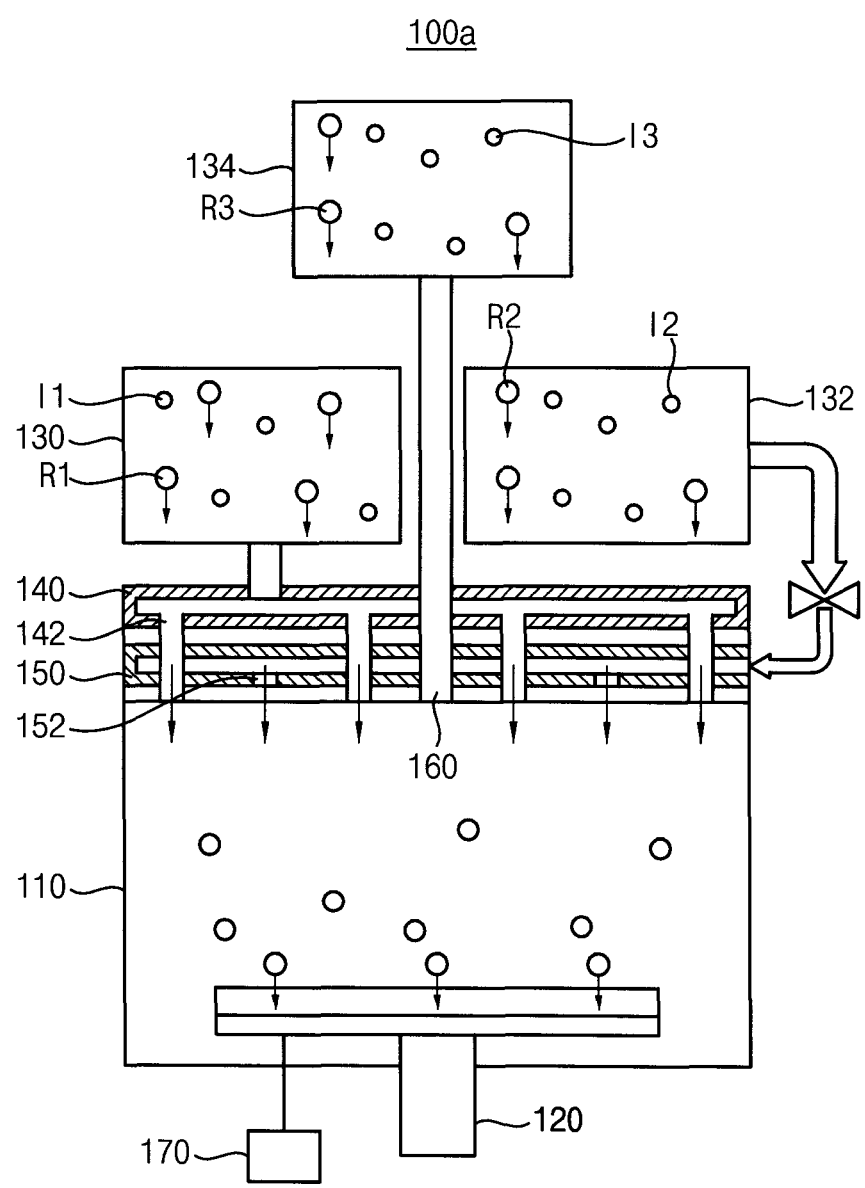
Figure 5:
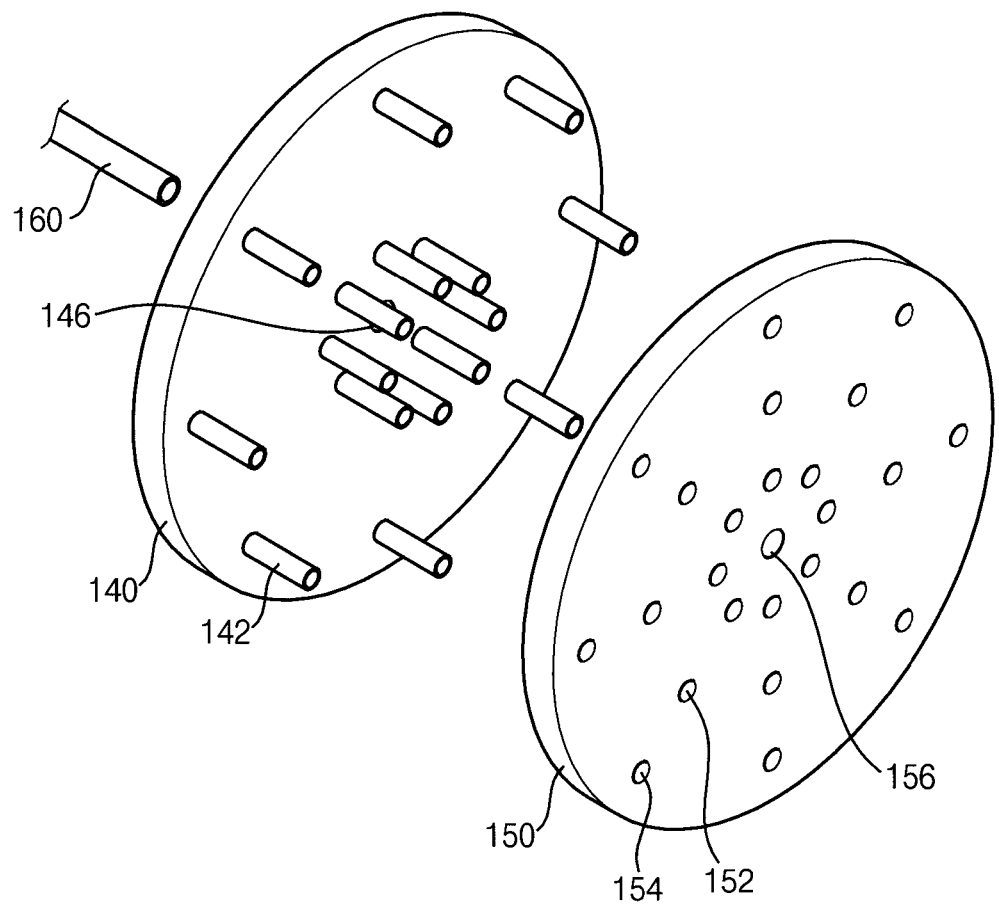

FIG. 4 is a cross-sectional view illustrating an apparatus for processing a substrate in accordance with an example embodiment, and FIG. 5 is a perspective view illustrating a first showerhead and a second showerhead of the apparatus in FIG. 4.

An apparatus 100a for processing a substrate in accordance with this example embodiment may include elements substantially the same as those of the apparatus 100 in FIG. 1 except for further including a third remote plasma source and a third showerhead. Thus, the same reference numerals may refer to the same elements and any further illustrations with respect to the same elements may be omitted herein for brevity.

Referring to FIGS. 4 and 5, the third remote plasma source 134 may be located at the outside of the processing chamber 110. The third remote plasma source 134 may generate a third plasma from a third reaction gas. In some example embodiments, in which the apparatus 100 may include the plasma etching apparatus, the third reaction gas may include an etching gas.

Further, the third remote plasma source 134 may generate the third plasma from the third reaction gas under a third process recipe, which is different from the first process recipe and the second process recipe. The third process recipe may correspond to an optimal process recipe that may be capable of generating the third plasma used for etching the layer on the semiconductor substrate. Because the third reaction gas may be different from the first reaction gas and the second reaction gas, the third process recipe may be different from the first process recipe and the second process recipe. Therefore, the third process recipe may vary in accordance with kinds of the third reaction gas. The third process recipe may include process variables, for example, a pressure, a temperature, and/or a power.

The third plasma may include a plurality of ingredients. One of the ingredients may be mainly used for etching the layer on the semiconductor substrate. For example, the third plasma may include, for example, a third radical R3, a third ion I3, an electron, and an ultraviolet light. The third radical R3 may isotropically etch the layer on the semiconductor substrate. In contrast, the third ion I3 may anisotropically etch the layer on the semiconductor substrate. The third radical R3 may be mainly used for etching the layer on the semiconductor substrate.

The third showerhead 160 may be connected to the third remote plasma source 134. In some example embodiments, the third showerhead 160 may have a tubular shape extended from the third remote plasma source 134 into the processing chamber 110. The third showerhead 160 may be inserted into the processing chamber 110 through the first showerhead 140 and the second showerhead 150. Thus, the first showerhead 140 and the second showerhead 150 may have holes 146 and 156 through which the third showerhead 160 may pass through.

In some example embodiments, the third showerhead 160 may have an inner diameter for allowing only the third radical R3 to pass through the third showerhead 160. In contrast, for example, the third ion I3 and/or the electron may not pass through the third showerhead 160. Thus, when the third plasma may flow through the third showerhead 160, only the third radical R3 may pass through the third showerhead 160 so that only the third radical R3 may be applied to the semiconductor substrate. In contrast, because the third ion I3 and/or the electron may not pass through the third showerhead 160, the third ion I3 and/or the electron may not be applied to the semiconductor substrate. The inner diameter of the third showerhead 160 may vary in accordance with the kinds of the third reaction gas.

Figure 6:
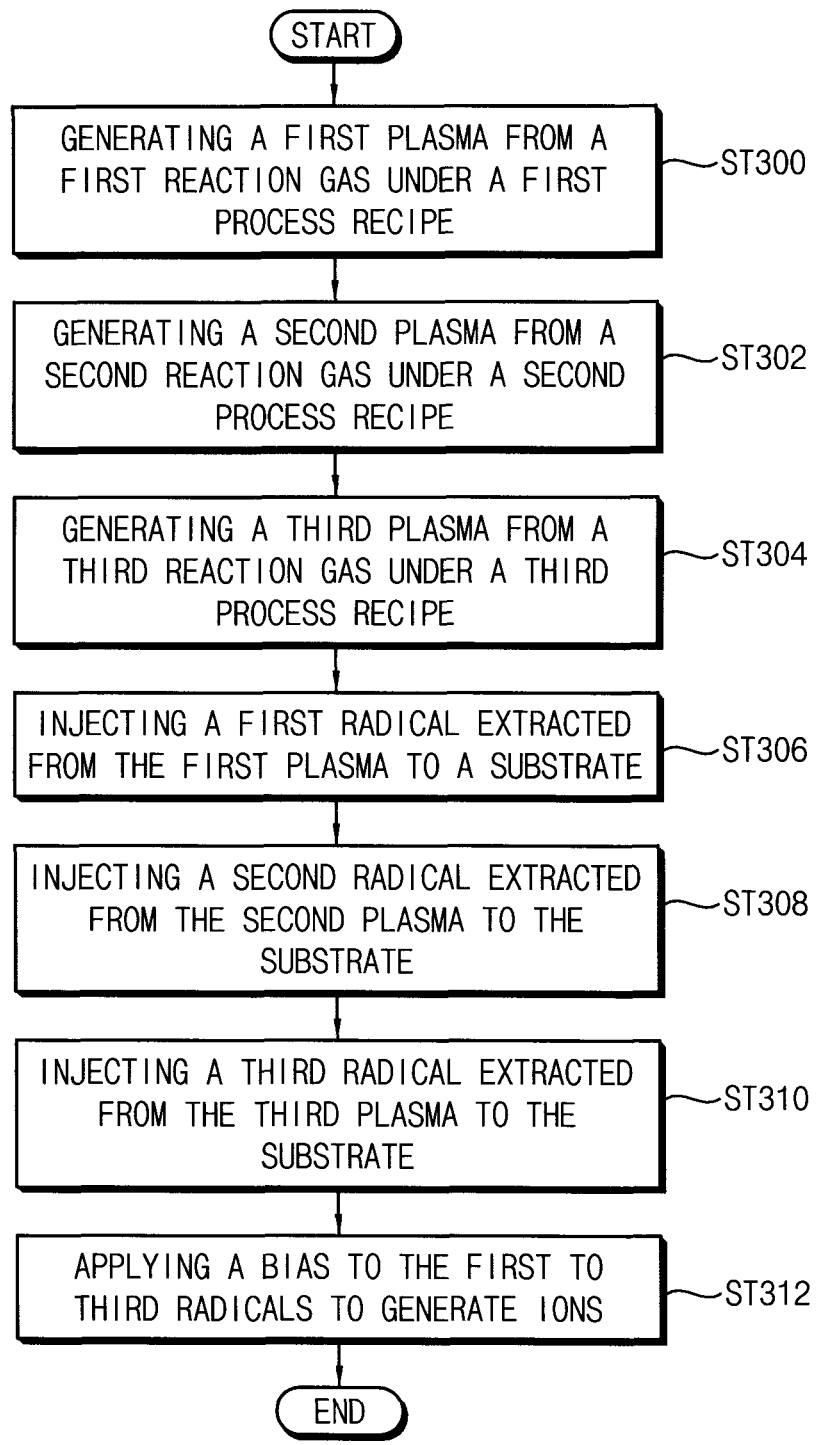

FIG. 6 is a flow chart illustrating a method of processing a substrate using the apparatus in FIG. 4.

Referring to FIGS. 4 and 6 in step ST300, the first remote plasma source 130 may generate the first plasma from the first reaction gas under the first process recipe. The first plasma may include, for example, the first radical R1 and the first ion I1. In some example embodiments, the first process recipe may correspond to an optimal process recipe for generating the first plasma from the first reaction gas.

In step ST302, the second remote plasma source 132 may generate the second plasma from the second reaction gas under the second process recipe. The second plasma may include, for example, the second radical R2 and the second ion I2. In some example embodiments, the second process recipe may correspond to an optimal process recipe for generating the second plasma from the second reaction gas.

In step ST304, the third remote plasma source 134 may generate the third plasma from the third reaction gas under the third process recipe. The third plasma may include, for example, the third radical R3 and the third ion I3. In example some embodiments, the third process recipe may correspond to an optimal process recipe for generating the third plasma from the third reaction gas.

In step ST306, the first plasma may be introduced into the first showerhead 140. When the first plasma flows through the first extracting holes 142 of the first showerhead 140, only the first radical R1 may pass through the first extracting holes 142. In contrast, for example, the first ion I1 may not pass through the first extracting holes 142. Thus, only the first radical R1 may be injected to the semiconductor substrate on the stage 120 through the injecting tubes 144 to etch the layer on the semiconductor substrate.

In step ST308, the second plasma may be introduced into the second showerhead 150. When the second plasma flows through the second extracting holes 152 of the second showerhead 150, only the second radical R2 may pass through the second extracting holes 152. In contrast, for example, the second ion I2 may not pass through the second extracting holes 152. Thus, only the second radical R2 may be injected to the semiconductor substrate on the stage 120 through the second extracting holes 152 to etch the layer on the semiconductor substrate.

In step ST310, the third plasma may be introduced into the third showerhead 160. When the third plasma flows through the third showerhead 160, only the third radical R3 may pass through the third showerhead 160. In contrast, for example, the third ion I3 may not pass through the third showerhead 160. Thus, only the third radical R3 may be injected to the semiconductor substrate on the stage 120 through the third showerhead 160 to etch the layer on the semiconductor substrate.

In example embodiments, the first radical R1, the second radical R2 and the third radical R3 may be individually applied to the semiconductor substrate so that the first radical R1, the second radical R2 and the third radical R3 may be independently controlled. Thus, an etching process for etching the layer on the semiconductor substrate may be improved. Further, because the ions may not be applied to the semiconductor substrate, damage to the layer caused by the ions may be mitigated or prevented.

Additionally, in step ST312, the bias-applying member 170 may apply the bias to the first radical R1, the second radical R2 and the third radical R3 to generate the ions from the first radical R1, the second radical R2 and the third radical R3. The ions may be applied to the layer on the semiconductor substrate to anisotropically etch the layer.

In some example embodiments, the two or three reaction gases may be used so that the two or three remote plasma sources and the showerheads may be employed in the apparatus. Alternatively, at least four reaction gases may be used so that at least four remote plasma sources and showerheads may be employed in the apparatus. The number of the remote plasma source and the showerhead may vary in accordance with the number of the reaction gases.

Further, in some example embodiments, the apparatus may include the etching apparatus. In some example embodiments, the apparatus may include, for example, a cleaning apparatus, or a deposition apparatus.

According to some example embodiments, each of the at least two remote plasma sources may generate the at least two plasmas under different process recipes that may be optimized for processing the substrate. Thus, the substrate processed using the optimal plasmas may have a desired shape. Further, ingredients in the plasma, which may damage the substrate, may be excluded. In contrast, only a main ingredient used for processing the substrate may be extracted so that damage to the substrate can be mitigated or suppressed.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of processing a substrate, the method comprising:
   generating a first plasma from a first reaction gas;
   generating a second plasma from a second reaction gas;
   extracting a first ingredient used for processing the substrate from ingredients in the first plasma;
   extracting a second ingredient used for processing the substrate from ingredients in the second plasma; and
   individually applying the first ingredient and the second ingredient to the substrate that is held in a processing chamber, wherein:
   extracting the first ingredient from the first plasma includes flowing the first plasma through a first extracting hole defined in a shower head, the first extracting hole having a size that allows only the first ingredient from ingredients in the first plasma to pass therethrough,
   extracting the second ingredient from the second plasma includes flowing the second plasma through a second extracting hole defined in the shower head, the second extracting hole having a size that allows only the second ingredient from ingredients in the second plasma to pass therethrough,
   individually applying the first ingredient to the substrate includes injecting the first ingredient from the first extracting hole to the substrate that is held in the processing chamber,
   individually applying the second ingredient to the substrate includes injecting the second ingredient from the second extracting hole to the substrate that is held in the processing chamber.

2. The method of claim 1, wherein the generating a first plasma is performed under a first process recipe, and the generating a second plasma is performed under a second process recipe different from the first process recipe.

3. The method of claim 1, wherein the first ingredient comprises a first radical for etching the substrate.

4. The method of claim 1, wherein the second ingredient comprises a second radical for etching the substrate.

5. The method of claim 1, further comprising:
   generating ions used for processing the substrate from the extracted first ingredient and the extracted second ingredient.

6. The method of claim 5, wherein the generating ions comprises applying a bias to the extracted first ingredient and the extracted second ingredient.

7. The method of claim 1, further comprising:
   generating a third plasma from a third reaction gas; and
   applying the third plasma to the substrate independently from the first plasma and the second plasma.

8. The method of claim 7, further comprising:
   extracting a third ingredient used for processing the substrate from ingredients in the third plasma.

9. The method of claim 1, wherein the first extracting hole is in direct fluid communication with the processing chamber, and wherein the second extracting hole is in direct fluid communication with the processing chamber.

10. A method of processing a substrate, the method comprising:
    extracting a first radical from a first plasma introduced from a first remote plasma source;
    extracting a second radical from a second plasma introduced from a second remote plasma source; and
    individually applying the first radical and the second radical to the substrate that is held in a processing chamber, wherein:
    extracting the first radical includes passing the first plasma through at least one first extracting hole defined in a first shower head that is connected to the first remote plasma source, the first shower head positioned at an upper inner space of the processing chamber,
    extracting the second radical includes passing the second plasma through at least one second extracting hole defined in a second shower head that is connected to the second remote plasma source, the second shower head positioned at the upper inner space of the processing chamber and under the first shower head.

11. The method of claim 10, further comprising:
    generating ions used for processing the substrate by applying a bias to the first radical and the second radical.

12. The method of claim 10, wherein the first radical and the second radical are different from each other.

13. The method of claim 10, wherein:
    individually applying the first radical to the substrate includes injecting the first radical from the at least one first extracting hole to the substrate that is held in the processing chamber,
    individually applying the second radical to the substrate includes injecting the second radical from the at least one second extracting hole to the substrate that is held in the processing chamber.

14. The method of claim 10, wherein the first shower head is directly connected to the first remote plasma source, and wherein the second shower head is directly connected to the second remote plasma source.

15. The method of claim 10, wherein the at least one first extracting hole extends through the first and second showerheads, and wherein the at least one second extracting hole extends through the second showerhead but not the first showerhead.

* * * * *